(12) United States Patent
Ha et al.

(10) Patent No.: US 7,687,897 B2
(45) Date of Patent: Mar. 30, 2010

(54) MOUNTABLE INTEGRATED CIRCUIT PACKAGE-IN-PACKAGE SYSTEM WITH ADHESIVE SPACING STRUCTURES

(75) Inventors: Jong-Woo Ha, Seoul (KR); SeongMin Lee, Seoul (KR); JoHyun Bae, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 104 days.

(21) Appl. No.: 11/617,413

(22) Filed: Dec. 28, 2006

(65) Prior Publication Data

US 2008/0157319 A1    Jul. 3, 2008

(51) Int. Cl.
*H01L 23/538*   (2006.01)
*H01L 21/56*    (2006.01)
*H01L 23/48*    (2006.01)
*H01L 23/52*    (2006.01)

(52) U.S. Cl. .............. 257/686; 257/E23.169; 257/E25.013; 257/E25.023; 257/777; 257/723; 257/786; 257/784; 257/738; 257/737; 257/678; 257/687

(58) Field of Classification Search .......... 257/E23.169, 257/E25.013, E25.023, 777, 686, 786, 784, 257/738, 737, 678, 687, 734, 723; 438/109, 438/613

See application file for complete search history.

(56) References Cited

U.S. PATENT DOCUMENTS

| | | | |
|---|---|---|---|
| 5,646,828 | A | 7/1997 | Degani et al. |
| 5,663,593 | A | 9/1997 | Mostafazadeh et al. |
| 6,005,778 | A | 12/1999 | Spielberger et al. |
| 6,111,306 | A | 8/2000 | Kawahara et al. |
| 6,255,740 | B1 | 7/2001 | Tsuji et al. |
| 6,785,137 | B2 | 8/2004 | Siegel |
| 6,861,288 | B2 | 3/2005 | Shim et al. |

(Continued)

*Primary Examiner*—Alexander O Williams
(74) *Attorney, Agent, or Firm*—Mikio Ishimaru (57) ABSTRACT

A mountable integrated circuit package-in-package system is provided including mounting an adhesion spacer over an integrated circuit die and a package substrate, mounting an integrated circuit package system having an inner adhesion structure with the inner adhesion structure on the adhesion spacer, and forming a package encapsulation for covering the integrated circuit package system over the adhesion spacer.

20 Claims, 6 Drawing Sheets

U.S. PATENT DOCUMENTS

| | | |
|---|---|---|
| 6,906,416 B2 | 6/2005 | Karnezos |
| 6,936,922 B1 | 8/2005 | Park et al. |
| 6,939,740 B2 | 9/2005 | Yamaguchi |
| 6,946,323 B1 | 9/2005 | Heo |
| 6,965,160 B2 | 11/2005 | Cobbley et al. |
| 6,967,395 B1 | 11/2005 | Glenn et al. |
| 6,972,481 B2 | 12/2005 | Karnezos |
| 7,071,421 B2 | 7/2006 | Heng et al. |
| 7,129,115 B2 | 10/2006 | Khiang |
| 7,144,800 B2 | 12/2006 | Mostafazadeh et al. |
| 7,239,164 B2 * | 7/2007 | Tamaki ............... 324/763 |
| 2003/0189256 A1 * | 10/2003 | Corisis et al. ......... 257/777 |
| 2004/0194882 A1 * | 10/2004 | Hung ................ 156/344 |
| 2004/0256709 A1 | 12/2004 | Hashimoto |
| 2005/0090050 A1 * | 4/2005 | Shim et al. ............. 438/200 |
| 2005/0133916 A1 * | 6/2005 | Karnezos ............... 257/738 |
| 2006/0102994 A1 * | 5/2006 | Pu ........................ 257/686 |
| 2006/0197206 A1 | 9/2006 | Kim et al. |
| 2006/0220209 A1 * | 10/2006 | Karnezos et al. ........ 257/686 |
| 2007/0187826 A1 * | 8/2007 | Shim et al. ............. 257/738 |
| 2007/0241442 A1 * | 10/2007 | Ha et al. ................ 257/686 |
| 2007/0278640 A1 * | 12/2007 | Weng et al. ............. 257/686 |
| 2007/0278658 A1 * | 12/2007 | Karnezos et al. ........ 257/692 |
| 2008/0006925 A1 * | 1/2008 | Yim et al. ............... 257/686 |
| 2008/0142957 A1 * | 6/2008 | Wang et al. ............. 257/723 |
| 2008/0171402 A1 * | 7/2008 | Karnezos ............... 438/15 |
| 2008/0197470 A1 * | 8/2008 | Yoshimura et al. ....... 257/686 |
| 2008/0237824 A1 * | 10/2008 | St. Amand et al. ...... 257/686 |

\* cited by examiner

MOUNTABLE INTEGRATED CIRCUIT PACKAGE-IN-PACKAGE SYSTEM WITH ADHESIVE SPACING STRUCTURES

CROSS-REFERENCE TO RELATED APPLICATION(S)

The present application contains subject matter related to co-pending U.S. patent application Ser. No. 11/276,946, assigned to STATS ChipPAC Ltd.

TECHNICAL FIELD

The present invention relates generally to integrated circuit package system and more particularly to mountable integrated circuit package-in-package system.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages or package-in-packages (PIP) in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages with stacking configurations, or PIP, may also present problems. Spacer structures may be used to create space for electrical connections in the stacked structure. Package-in-package structures contain packaged integrated circuits in the stacked structures. Typical spacer structures and the encapsulation material of the packaged integrated circuits have low adhesion and become a source of delamination. Conventional spacer and packaged integrated circuits interface perform poorly in reliability test from the delamination at this interface.

Thus, a need still remains for a mountable integrated circuit package-in-package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package-in-package system including mounting an adhesion spacer over an integrated circuit die and a package substrate, mounting an integrated circuit package system having an inner adhesion structure with the inner adhesion structure on the adhesion spacer, and forming a package encapsulation for covering the integrated circuit package system over the adhesion spacer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
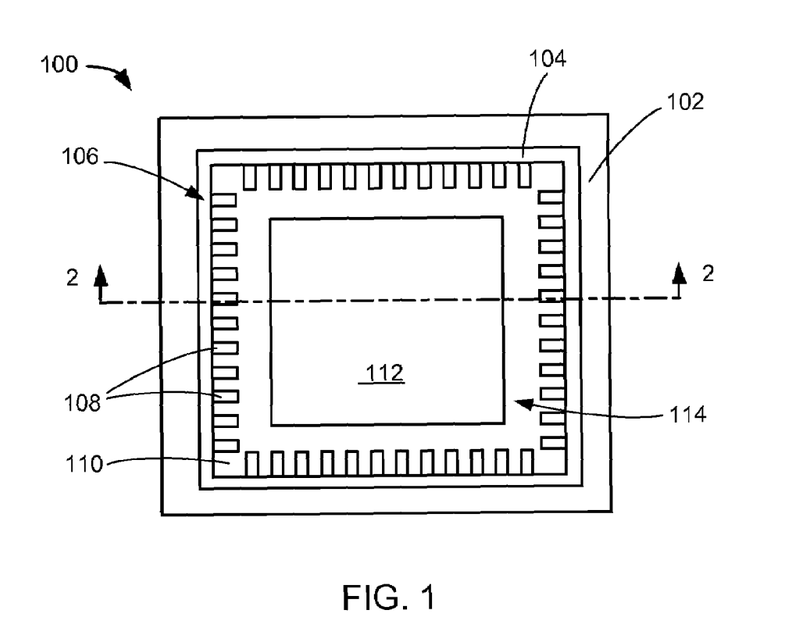
FIG. 1 is a top view of a mountable integrated circuit package-in-package system in an embodiment of the present invention.

Referring now to FIG. 1, therein is shown a top view of a mountable integrated circuit package-in-package system 100 in an embodiment of the present invention. The top view depicts a package encapsulation 102, such as an epoxy mold compound, having an opening 104. The opening 104 exposes a portion of an integrated circuit package system 106. Terminals 108, such as leads, surrounded by an inner encapsulation 110, such as an epoxy mold compound, are exposed in the opening 104. The inner encapsulation 110 exposes a backside 112 of a prepackaged integrated circuit die 114. The terminals 108, the inner encapsulation 110, and the prepackaged integrated circuit die 114 are part of the integrated circuit package system 106.

Figure 2:
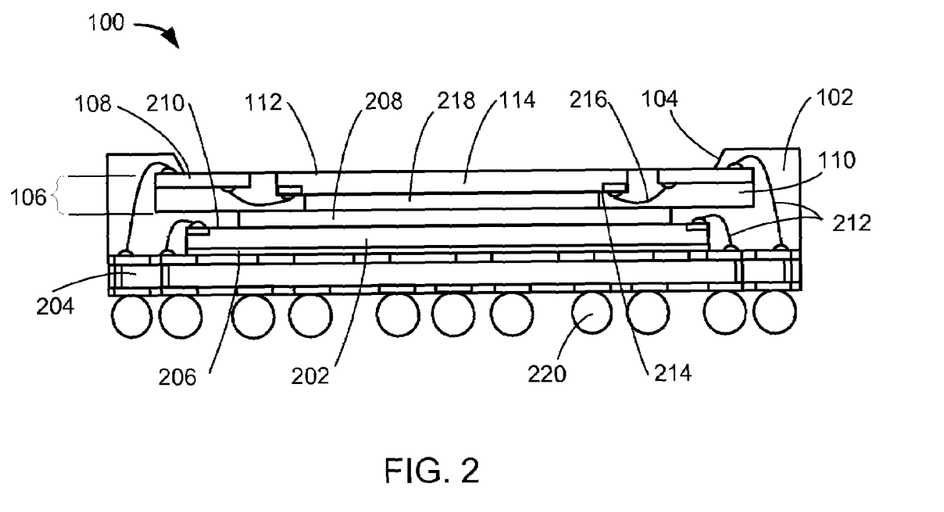
FIG. 2 is a cross-sectional view of the mountable integrated circuit package-in-package system along 2-2 of FIG. 1.

Referring now to FIG. 2, therein is shown a cross-sectional view of the mountable integrated circuit package-in-package system 100 along 2-2 of FIG. 1. The cross-sectional view depicts an integrated circuit die 202 mounted over a package substrate 204, such as a laminate substrate, with an adhesive 206, such as a die-attach adhesive.

An adhesion spacer 208, such as a polymer or metallic spacer, is between an active side 210 of the integrated circuit die 202 and the integrated circuit package system 106. The active side 210 has circuitry (not shown) thereon. The adhesion spacer 208 does not impede connections of internal interconnects 212, such as bond wires or ribbon bond wires, between the active side 210 and the package substrate 204.

The integrated circuit package system 106 is shown in an inverted orientation forming a face-to-face configuration with a topside 214 of the prepackaged integrated circuit die 114 facing the active side 210. The topside 214 has circuitry (not shown) thereon.

Inner interconnects 216, such as bond wires or ribbon bond wires, connect the topside 214 and the terminals 108. The inner encapsulation 110 exposes an inner adhesion structure 218, such as a polymer or metallic structure, which is on the topside 214. The inner adhesion structure 218 does not impede the connections of the Inner interconnects 216 with the topside 214.

The adhesion spacer 208 forms a predetermined adhesion with the active side 210 to mitigate or eliminate delamination at this interface. The inner adhesion structure 218 and the adhesion spacer 208 also forms a predetermined adhesion with each other that is better than the adhesion formed between the adhesion spacer 208 and the inner encapsulation 110. The adhesion between the inner adhesion structure 218 and the adhesion spacer 208 mitigates or eliminates delamination at this interface. Reduction or elimination of delamination sources improves reliability and performance in reliability tests, such as moisture sensitivity level (MSL) tests, of the mountable integrated circuit package-in-package system 100.

The adhesion spacer 208 and the inner adhesion structure 218 may also function as heat dissipation structures. Heat may flow from the integrated circuit die 202 through the adhesion spacer 208, the inner adhesion structure 218, and the prepackaged integrated circuit die 114 dissipating to ambient from the backside 112.

It has been discovered that the present invention provides improved reliability, such as improved resistance to delamination and improved thermal performance. The adhesion between the inner adhesion structure 218 of the integrated circuit package system 106 and the adhesion spacer 208 reduces or eliminates delamination at this interface. This improves performance in reliability tests, such as MSL test. Also, the adhesion spacer 208 and the inner adhesion structure 218 may be formed from thermally conductive material, such as a metal or metal alloy, providing thermal flow paths. The thermal flow paths improve the thermal performance of the mountable integrated circuit package-in-package system 100.

The internal interconnects 212 also connect the terminals 108 and the package substrate 204. External interconnects 220, such as solder balls, connect to the package substrate 204 on a side opposite the integrated circuit die 202. The External interconnects 220 connect to the next system level (not shown), such as printed circuit board or another packaged device. The package encapsulation 102 is over a side of the package substrate 204 having the integrated circuit die 202. The package encapsulation 102 covers the integrated circuit die 202, the adhesion spacer 208, the internal interconnects 212, and a portion of the integrated circuit package system 106. The opening 104 in the package encapsulation 102 exposes portions of the terminals 108, portions of the inner encapsulation 110, and the backside 112 of the prepackaged integrated circuit die 114.

Figure 3:
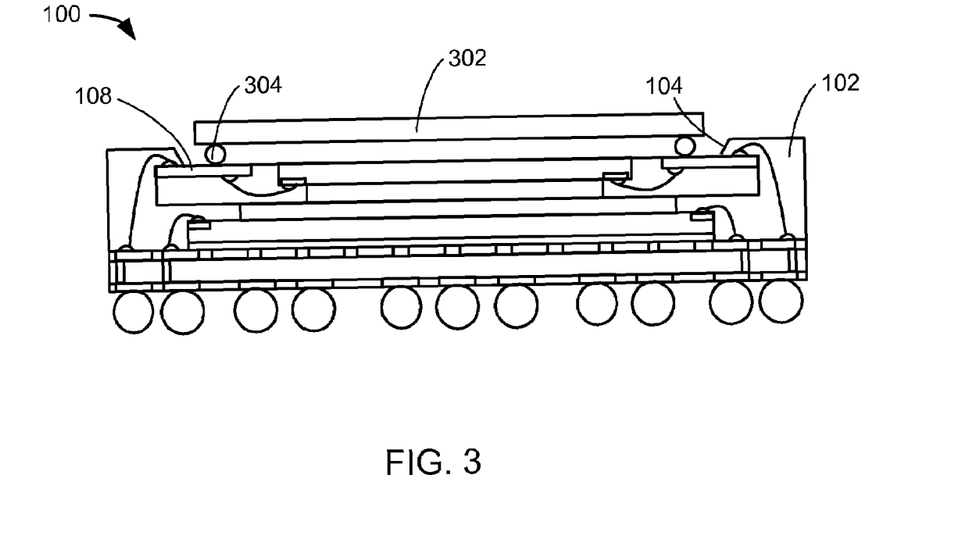
FIG. 3 is a cross-sectional view of the mountable integrated circuit package-in-package system of FIG. 1 with a device.

Referring now to FIG. 3, therein is shown a cross-sectional view of the mountable integrated circuit package-in-package system 100 of FIG. 1 with a device 302. The device 302 may be a number of different elements, such as a flip chip, a discrete passive component, or another mountable integrated circuit package-in-package system (not shown). The device 302 has interconnects 304, such as solder bumps. The device 302 mounts on the mountable integrated circuit package-in-package system 100 in the opening 104 of the package encapsulation 102. The interconnects 304 attach with the terminals 108 exposed in the opening 104.

Figure 4:
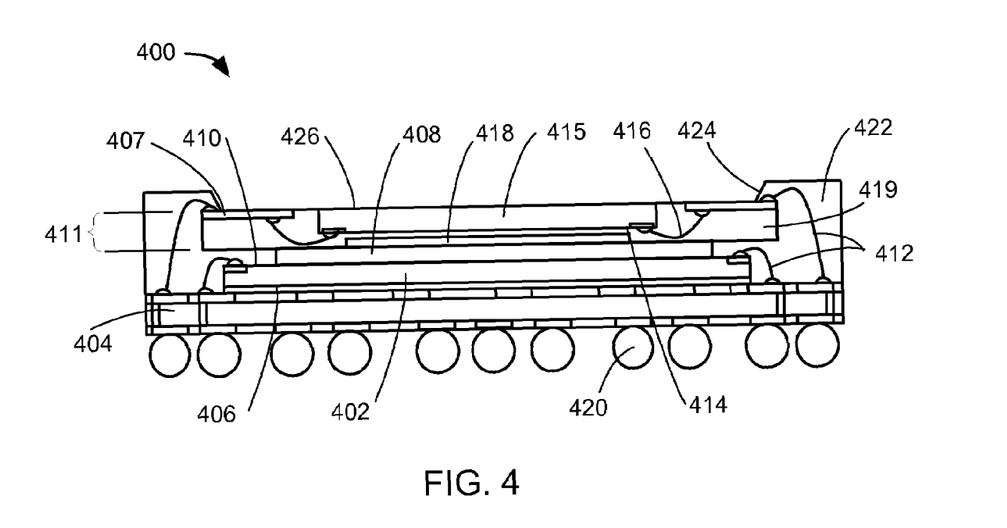
FIG. 4 is a cross-sectional view of a mountable integrated circuit package-in-package system along 2-2 of FIG. 1 in an alternative embodiment of the present invention.

Referring now to FIG. 4, therein is shown a cross-sectional view of a mountable integrated circuit package-in-package system 400 along 2-2 of FIG. 1 in an alternative embodiment of the present invention. The top view shown in FIG. 1 for the mountable integrated circuit package-in-package system 100 of FIG. 1 may also represent the top view of the mountable integrated circuit package-in-package system 400. The cross-sectional view depicts an integrated circuit die 402 mounted over a package substrate 404, such as a laminate substrate, with an adhesive 406, such as a die-attach adhesive.

An adhesion spacer 408, such as a polymer or metallic spacer, is between an active side 410 of the integrated circuit die 402 and an integrated circuit package system 411. The active side 410 has circuitry (not shown) thereon. The adhesion spacer 408 does not impede connections of internal interconnects 412, such as bond wires or ribbon bond wires, between the active side 410 and the package substrate 404.

The integrated circuit package system 411 is shown in an inverted orientation forming a face-to-face configuration with a topside 414 of a prepackaged integrated circuit die 415 facing the active side 410. The topside 414 has circuitry (not shown) thereon.

Inner interconnects 416, such as bond wires or ribbon bond wires, connect the topside 414 and terminals 417. An inner encapsulation 419 exposes an inner adhesion structure 418, such as a polymer or metallic structure, which is over the topside 414 and not in contact with the topside 414. The inner adhesion structure 418 does not impede the connections of the Inner interconnects 416 with the topside 414.

The adhesion spacer 408 forms a predetermined adhesion with the active side 410 to mitigate or eliminate delamination at this interface. The inner adhesion structure 418 and the adhesion spacer 408 also forms a predetermined adhesion with each other that is better than the adhesion formed between the adhesion spacer 408 and the inner encapsulation 419. The adhesion between the inner adhesion structure 418 and the adhesion spacer 408 mitigates or eliminates delamination at this interface. Reduction or elimination of delamination sources improves reliability and performance in reliability tests, such as moisture sensitivity level (MSL) tests, of the mountable integrated circuit package-in-package system 400.

The internal interconnects 412 also connect the terminals 417 and the package substrate 404. External interconnects 420, such as solder balls, connect to the package substrate 404 on a side opposite the integrated circuit die 402. The External interconnects 420 connect to the next system level (not shown), such as printed circuit board or another packaged device. A package encapsulation 422 is over a side of the package substrate 404 having the integrated circuit die 402. The package encapsulation 422 covers the integrated circuit die 402, the adhesion spacer 408, the internal interconnects 412, and a portion of the integrated circuit package system 411. An opening 424 in the package encapsulation 422 exposes portions of the terminals 417, portions of the inner encapsulation 419, and a backside 426 of the prepackaged integrated circuit die 415.

Figure 5:
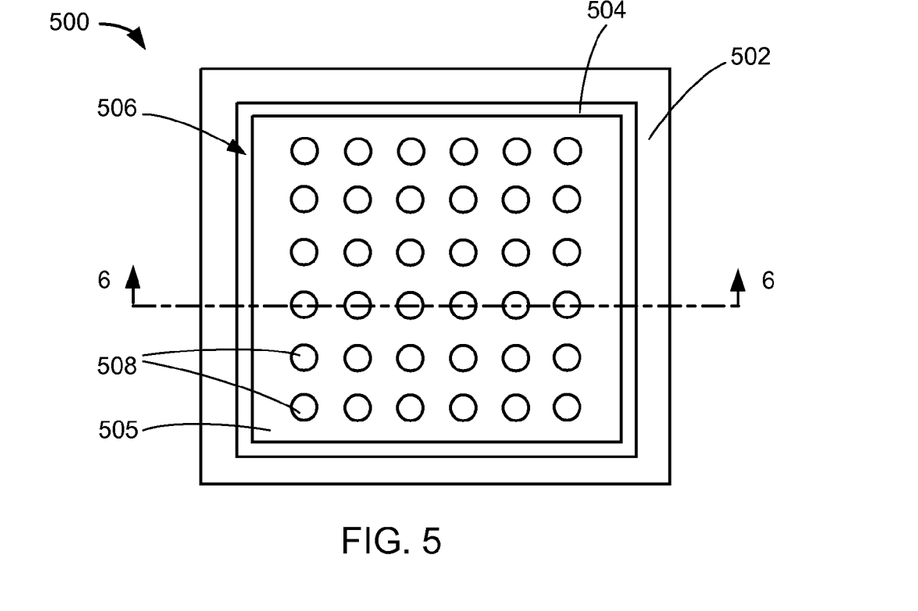
FIG. 5 is a top view of a mountable integrated circuit package-in-package system in another alternative embodiment of the present invention.

Referring now to FIG. 5, therein is shown a top view of a mountable integrated circuit package-in-package system 500 in another alternative embodiment of the present invention. The top view depicts a package encapsulation 502, such as an epoxy mold compound, having an opening 504. The opening 504 exposes a portion of an integrated circuit package system 506. The opening 504 exposes an interposer 505, such as a laminate substrate, having terminals 508, such as contact sites. The terminals 508 and the interposer 505 are part of the integrated circuit package system 506.

Figure 6:
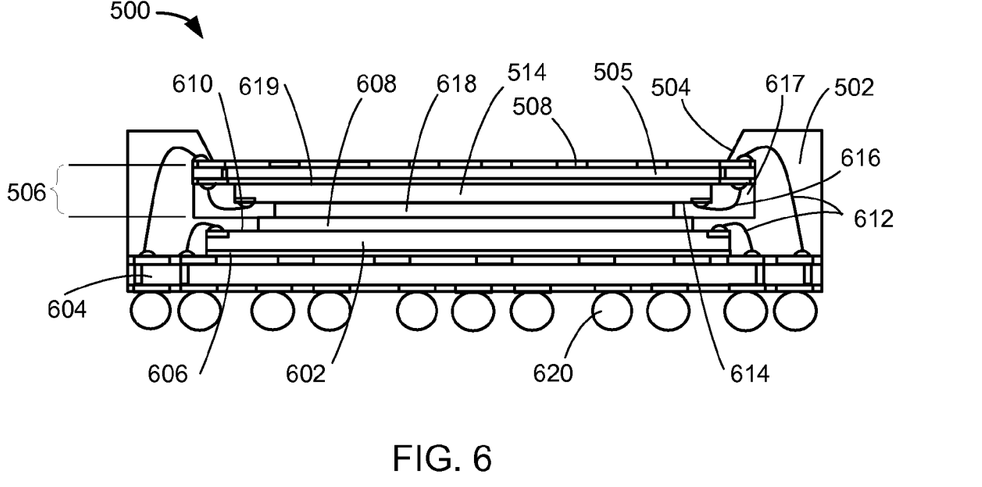
FIG. 6 is a cross-sectional view of the mountable integrated circuit package-in-package system along 6-6 of FIG. 5.

Referring now to FIG. 6, therein is shown a cross-sectional view of the mountable integrated circuit package-in-package system 500 along 6-6 of FIG. 5. The cross-sectional view depicts an integrated circuit die 602 mounted over a package substrate 604, such as a laminate substrate, with an adhesive 606, such as a die-attach adhesive.

An adhesion spacer 608, such as a polymer or metallic spacer, is between an active side 610 of the integrated circuit die 602 and the integrated circuit package system 506. The active side 610 has circuitry (not shown) thereon. The adhesion spacer 608 does not impede connections of internal interconnects 612, such as bond wires or ribbon bond wires, between the active side 610 and the package substrate 604.

The integrated circuit package system 506 is shown in an inverted orientation forming a face-to-face configuration with a topside 614 of a prepackaged integrated circuit die 514 of the integrated circuit package system 506 facing the active side 610. The topside 614 has circuitry (not shown) thereon.

Inner interconnects 616, such as bond wires or ribbon bond wires, connect the topside 614 and the interposer 505. An inner encapsulation 617, such as an epoxy mold compound, exposes an inner adhesion structure 618, such as a polymer or metallic structure, which is on the topside 614. The inner encapsulation 617 covers the prepackaged integrated circuit die 514 and the Inner interconnects 616 over a side of the interposer 505 having the prepackaged integrated circuit die 514. The inner adhesion structure 618 does not impede the connections of the Inner interconnects 616 with the topside 614.

The adhesion spacer 608 forms a predetermined adhesion with the active side 610 to mitigate or eliminate delamination at this interface. The inner adhesion structure 618 and the adhesion spacer 608 also forms a predetermined adhesion with each other that is better than the adhesion formed between the adhesion spacer 608 and the inner encapsulation 617. The adhesion between the inner adhesion structure 618 and the adhesion spacer 608 mitigates or eliminates delamination at this interface. Reduction or elimination of delamination sources improves reliability and performance in reliability tests, such as moisture sensitivity level (MSL) tests, of the mountable integrated circuit package-in-package system 500.

The adhesion spacer 608 and the inner adhesion structure 618 may also function as heat dissipation structures. Heat may flow from the integrated circuit die 602 through the adhesion spacer 608, the inner adhesion structure 618, and the prepackaged integrated circuit die 514 dissipating to ambient from a backside 619 of the prepackaged integrated circuit die 514.

The internal interconnects 612 also connect the interposer 505 and the package substrate 604. External interconnects 620, such as solder balls, connect to the package substrate 604 on a side opposite the integrated circuit die 602. The External interconnects 620 connect to the next system level (not shown), such as printed circuit board or another packaged device. The package encapsulation 502 is over a side of the package substrate 604 having the integrated circuit die 602. The package encapsulation 502 covers the integrated circuit die 602, the adhesion spacer 608, the internal interconnects 612, and a portion of the integrated circuit package system 506. The opening 504 in the package encapsulation 502 exposes a portion of the interposer 505 and the terminals 508.

Figure 7:
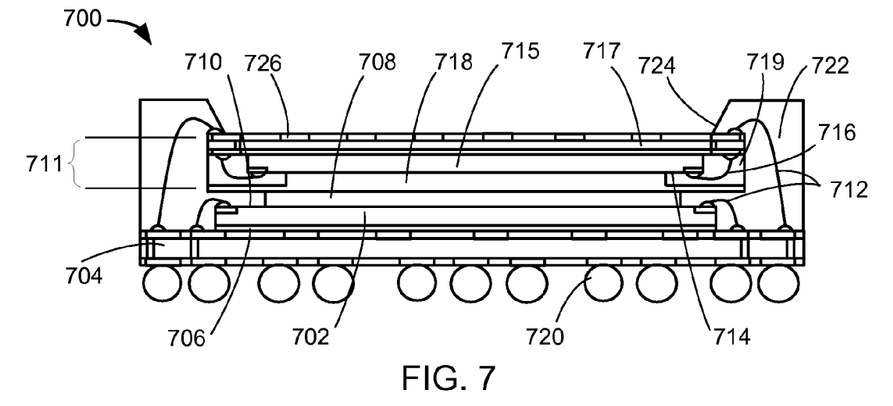
FIG. 7 is a cross-sectional view of a mountable integrated circuit package-in-package system along 6-6 of FIG. 5 in yet another alternative embodiment of the present invention.

Referring now to FIG. 7, therein is shown cross-sectional view of a mountable integrated circuit package-in-package system 700 along 6-6 of FIG. 5 in yet another alternative embodiment of the present invention. The top view shown in FIG. 5 for the mountable integrated circuit package-in-package system 500 of FIG. 5 may also represent the top view of the mountable integrated circuit package-in-package system 700. The cross-sectional view depicts an integrated circuit die 702 mounted over a package substrate 704, such as a laminate substrate, with an adhesive 706, such as a die-attach adhesive.

An adhesion spacer 708, such as a polymer or metallic spacer, is between an active side 710 of the integrated circuit die 702 and an integrated circuit package system 711. The active side 710 has circuitry (not shown) thereon. The adhesion spacer 708 does not impede connections of internal interconnects 712, such as bond wires or ribbon bond wires, between the active side 710 and the package substrate 704.

The integrated circuit package system 711 is shown in an inverted orientation forming a face-to-face configuration with a topside 714 of a prepackaged integrated circuit die 715 facing the active side 710. The topside 714 has circuitry (not shown) thereon.

Inner interconnects 716, such as bond wires or ribbon bond wires, connect the topside 714 and an interposer 717. An inner encapsulation 719, such as an epoxy mold compound, covers the prepackaged integrated circuit die 715 and the Inner interconnects 716 over a side of the interposer 717 having the prepackaged integrated circuit die 715.

An inner adhesion structure 718, such as a polymer or metallic structure, is on the topside 714 an over the inner encapsulation 719. The inner adhesion structure 718 does not impede the connections of the Inner interconnects 716 with the topside 714.

The adhesion spacer 708 forms a predetermined adhesion with the active side 710 to mitigate or eliminate delamination at this interface. The adhesion spacer 708 and the inner adhesion structure 718 also form a predetermined adhesion with each other. The adhesion spacer 708 does not contact the inner encapsulation 719 eliminating a delamination interface. The adhesion between the inner adhesion structure 718 and the adhesion spacer 708 mitigates or eliminates delamination at this interface. Reduction or elimination of delamination sources improves reliability and performance in reliability tests, such as moisture sensitivity level (MSL) tests, of the mountable integrated circuit package-in-package system 700.

The internal interconnects 712 also connect the interposer 717 and the package substrate 704. External interconnects 720, such as solder balls, connect to the package substrate 704 on a side opposite the integrated circuit die 702. The External interconnects 720 connect to the next system level (not shown), such as printed circuit board or another packaged device. A package encapsulation 722 is over a side of the package substrate 704 having the integrated circuit die 702. The package encapsulation 722 covers the integrated circuit die 702, the adhesion spacer 708, the internal interconnects 712, and a portion of the integrated circuit package system 711. An opening 724 in the package encapsulation 722 exposes the interposer 717 having terminals 726.

Figure 8:
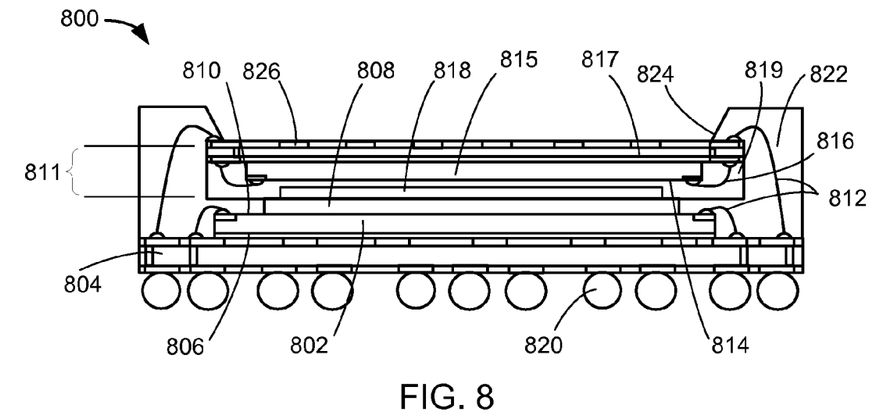
FIG. 8 is a cross-sectional view of a mountable integrated circuit package-in-package system along 6-6 of FIG. 5 in yet another alternative embodiment of the present invention.

Referring now to FIG. 8, therein is shown a cross-sectional view of a mountable integrated circuit package-in-package system 800 along 6-6 of FIG. 5 in yet another alternative embodiment of the present invention. The top view shown in FIG. 5 for the mountable integrated circuit package-in-package system 500 of FIG. 5 may also represent the top view of the mountable integrated circuit package-in-package system 800. The cross-sectional view depicts the mountable integrated circuit package-in-package system 800 having similar structure to the cross-sectional view of the mountable integrated circuit package-in-package system 500 of FIG. 6.

An integrated circuit die 802 mounts over a package substrate 804, such as a laminate substrate, with an adhesive 806, such as a die-attach adhesive. An adhesion spacer 808 is between an active side 810 of the integrated circuit die 802 and an integrated circuit package system 811.

The integrated circuit package system 811 is shown in an inverted orientation forming a face-to-face configuration with a topside 814 of a prepackaged integrated circuit die 815 facing the active side 810. Inner interconnects 816 connect the topside 814 and an interposer 817. An inner encapsulation 819 covers the prepackaged integrated circuit die 815 and the Inner interconnects 816 over a side of the interposer 817 having the prepackaged integrated circuit die 815.

The inner encapsulation 819 exposes an inner adhesion structure 818. The inner adhesion structure 818 is over the topside 814 and does not contact the topside 814. The inner adhesion structure 818 does not impede the connections of the Inner interconnects 816 with the topside 814.

The adhesion spacer 808 forms a predetermined adhesion with the active side 810 to mitigate or eliminate delamination at this interface. The adhesion spacer 808 and the inner adhesion structure 818 also forms a predetermined adhesion with each other that is better than the adhesion formed between the adhesion spacer 808 and the inner encapsulation 819. The adhesion between the inner adhesion structure 818 and the adhesion spacer 808 mitigates or eliminates delamination at this interface.

Internal interconnects 812 also connect the interposer 817 and the package substrate 804. External interconnects 820, such as solder balls, connect to the package substrate 804 on a side opposite the integrated circuit die 802. The External interconnects 820 connect to the next system level (not shown), such as printed circuit board or another packaged device. A package encapsulation 822 is over a side of the package substrate 804 having the integrated circuit die 802. The package encapsulation 822 covers the integrated circuit die 802, the adhesion spacer 808, the internal interconnects 812, and a portion of the integrated circuit package system 811. An opening 824 in the package encapsulation 822 exposes the interposer 817 having terminals 826.

Figure 9:
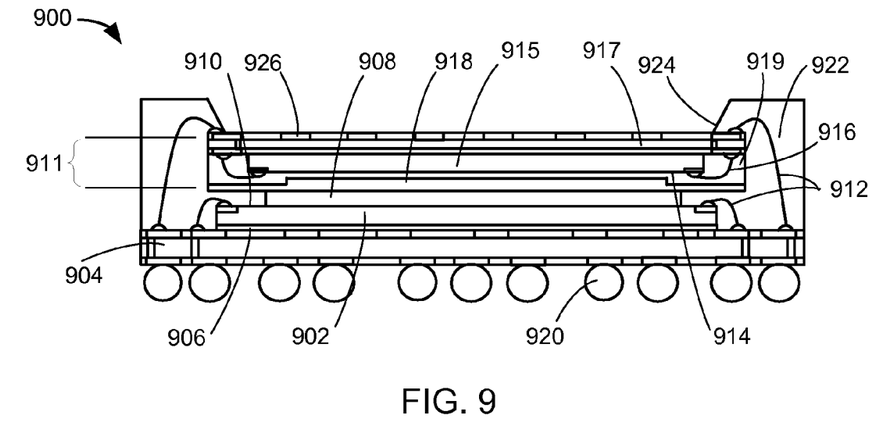
FIG. 9 is a cross-sectional view of a mountable integrated circuit package-in-package system along 6-6 of FIG. 5 in yet another alternative embodiment of the present invention.

Referring now to FIG. 9, therein is shown a cross-sectional view of a mountable integrated circuit package-in-package system 900 along 6-6 of FIG. 5 in yet another alternative embodiment of the present invention. The top view shown in FIG. 5 for the mountable integrated circuit package-in-package system 500 of FIG. 5 may also represent the top view of the mountable integrated circuit package-in-package system 900. The cross-sectional view depicts the mountable integrated circuit package-in-package system 900 having similar structure to the cross-sectional view of the mountable integrated circuit package-in-package system 700 of FIG. 7.

An integrated circuit die 902 mounts over a package substrate 904, such as a laminate substrate, with an adhesive 906, such as a die-attach adhesive. An adhesion spacer 908 is between an active side 910 of the integrated circuit die 902 and an integrated circuit package system 911.

The integrated circuit package system 911 is shown in an inverted orientation forming a face-to-face configuration with a topside 914 of a prepackaged integrated circuit die 915 facing the active side 910. Inner interconnects 916 connect the topside 914 and an interposer 917. An inner encapsulation 919 covers the prepackaged integrated circuit die 915 and the Inner interconnects 916 over a side of the interposer 917 having the prepackaged integrated circuit die 915.

An inner adhesion structure 918 is over the inner encapsulation 919. The inner adhesion structure 918 is over the topside 914 and does not contact the topside 914. The inner adhesion structure 918 does not impede the connections of the Inner interconnects 916 with the topside 914.

The adhesion spacer 908 forms a predetermined adhesion with the active side 910 to mitigate or eliminate delamination at this interface. The adhesion spacer 908 and the inner adhesion structure 918 also form a predetermined adhesion with each other. The adhesion spacer 908 and the inner encapsulation 919 do not contact each other. The adhesion between the inner adhesion structure 918 and the adhesion spacer 908 mitigates or eliminates delamination at this interface.

Internal interconnects 912 also connect the interposer 917 and the package substrate 904. External interconnects 920, such as solder balls, connect to the package substrate 904 on a side opposite the integrated circuit die 902. The External interconnects 920 connect to the next system level (not shown), such as printed circuit board or another packaged device. A package encapsulation 922 is over a side of the package substrate 904 having the integrated circuit die 902. The package encapsulation 922 covers the integrated circuit die 902, the adhesion spacer 908, the internal interconnects 912, and a portion of the integrated circuit package system 911. An opening 924 in the package encapsulation 922 exposes the interposer 917 having terminals 926.

Figure 10:
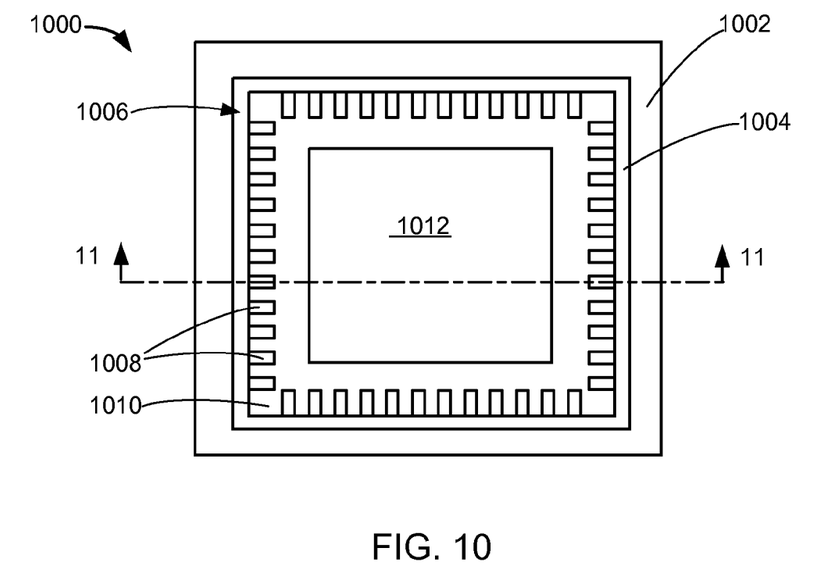
FIG. 10 is a top view of a mountable integrated circuit package-in-package system in yet another alternative embodiment of the present invention.

Referring now to FIG. 10, therein is shown a top view of a mountable integrated circuit package-in-package system 1000 in yet another alternative embodiment of the present invention. The top view depicts a package encapsulation 1002, such as an epoxy mold compound, having an opening 1004. The opening 1004 exposes a portion of an integrated circuit package system 1006. Terminals 1008, such as leads, surrounded by an inner encapsulation 1010, such as an epoxy mold compound, are exposed in the opening 1004. The inner encapsulation 1010 exposes a paddle 1012, such as a die-attach paddle. The terminals 1008, the inner encapsulation 1010, and the paddle 1012 are part of the integrated circuit package system 1006.

Figure 11:
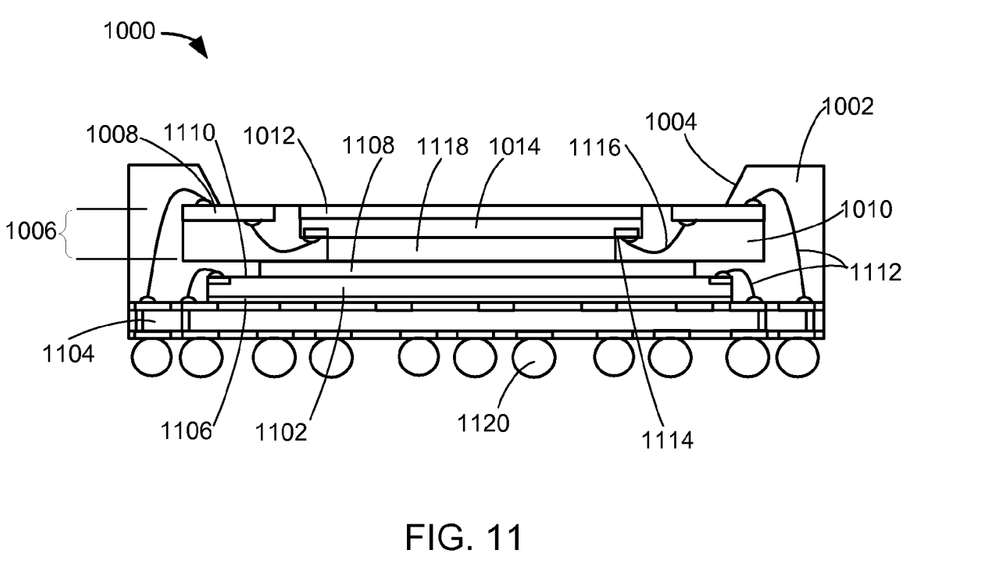
FIG. 11 is a cross-sectional view of the mountable integrated circuit package-in-package system along 11-11 of FIG. 10.

Referring now to FIG. 11, therein is shown a cross-sectional view of the mountable integrated circuit package-in-package system 1000 along 11-11 of FIG. 10. The cross-sectional view depicts an integrated circuit die 1102 mounted over a package substrate 1104 with an adhesive 11106.

An adhesion spacer 1108 is between an active side 1110 of the integrated circuit die 1102 and the integrated circuit package system 1006. The active side 1110 has circuitry (not shown) thereon. The adhesion spacer 1108 does not impede connections of internal interconnects 1112 between the active side 1110 and the package substrate 1104.

The integrated circuit package system 1006 is shown in an inverted orientation forming a face-to-face configuration with a topside 1114 of a prepackaged integrated circuit die 1014 facing the active side 1110. The topside 1114 has circuitry (not shown) thereon. The prepackaged integrated circuit die 1014 is mounted over the paddle 1012.

Inner interconnects 1116 connect the topside 1114 and the terminals 1008. The inner encapsulation 1010 exposes an inner adhesion structure 1118 that is on the topside 1114. The inner adhesion structure 1118 does not impede the connections of the Inner interconnects 1116 with the topside 1114.

The adhesion spacer 1108 forms a predetermined adhesion with the active side 1110 to mitigate or eliminate delamination at this interface. The inner adhesion structure 1118 and the adhesion spacer 1108 also forms a predetermined adhesion with each other that is better than the adhesion formed between the adhesion spacer 1108 and the inner encapsulation 1010. The adhesion between the inner adhesion structure 1118 and the adhesion spacer 1108 mitigates or eliminates delamination at this interface.

The adhesion spacer 1108 and the inner adhesion structure 1118 may also function as heat dissipation structures. Heat may flow from the integrated circuit die 1102 through the adhesion spacer 1108, the inner adhesion structure 1118, and the prepackaged integrated circuit die 1014 dissipating to ambient from the paddle 1012.

The internal interconnects 1112 also connect the terminals 1008 and the package substrate 1104. External interconnects 1120 connect to the package substrate 1104 on a side opposite the integrated circuit die 1102. The External interconnects 1120 connect to the next system level (not shown). The package encapsulation 1002 is over a side of the package substrate 1104 having the integrated circuit die 1102. The package encapsulation 1002 covers the integrated circuit die 1102, the adhesion spacer 1108, the internal interconnects 1112, and a portion of the integrated circuit package system 1006. The opening 1004 in the package encapsulation 1002 exposes portions of the terminals 1008, portions of the inner encapsulation 1010, and the paddle 1012.

Figure 12:
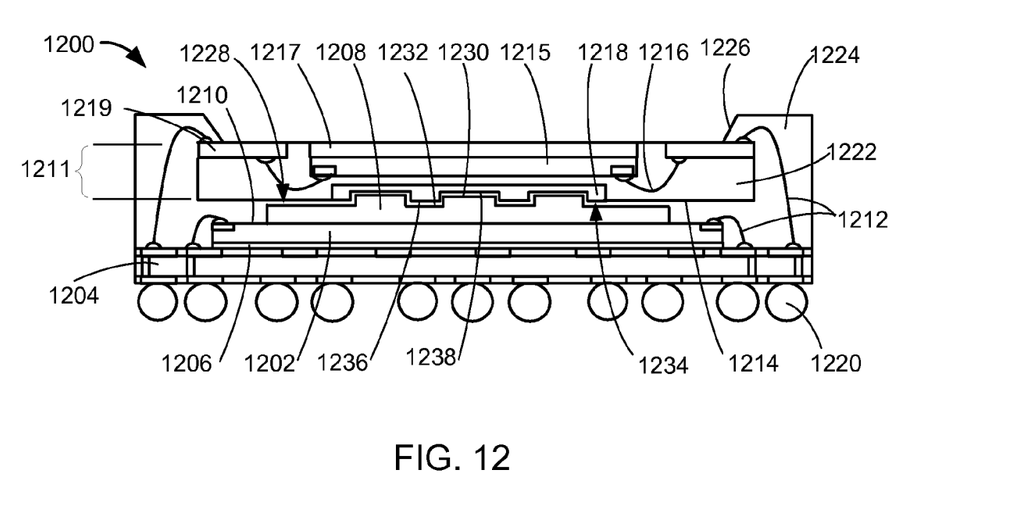
FIG. 12 is a cross-sectional view of a mountable integrated circuit package-in-package system along 11-11 of FIG. 10 in yet another embodiment of the present invention.

Referring now to FIG. 12, therein is shown a cross-sectional view of a mountable integrated circuit package-in-package system 1200 along 11-11 of FIG. 10 in yet another embodiment of the present invention. The top view shown in FIG. 10 for the mountable integrated circuit package-in-package system 1000 of FIG. 10 may also represent the top view of the mountable integrated circuit package-in-package system 1200. The cross-sectional view depicts an integrated circuit die 1202 mounted over a package substrate 1204 with an adhesive 1206.

An adhesion spacer 1208 is between an active side 1210 of the integrated circuit die 1202 and an integrated circuit package system 1211. The adhesion spacer 1208 has a first interface 1228, wherein the first interface 1228 has first protrusions 1230 in alternating positions with first recesses 1232. The active side 1210 has circuitry (not shown) thereon. The adhesion spacer 1208 does not impede connections of internal interconnects 1212 between the active side 1210 and the package substrate 1204.

The integrated circuit package system 1211 is shown in an inverted orientation forming a face-to-face configuration with a topside 1214 of a prepackaged integrated circuit die 1215 facing the active side 1210. The topside 1214 has circuitry (not shown) thereon. The prepackaged integrated circuit die 1215 is mounted over a paddle 1217.

Inner interconnects 1216 connect the topside 1214 and terminals 1219. An inner encapsulation 1222 exposes an inner adhesion structure 1218. The inner adhesion structure 1218 does not contact the topside 1214. The inner adhesion structure 1218 has a second interface 1234, wherein the second interface 1234 has second protrusions 1236 in alternating locations with second recesses 1238. The first interface 1228 and the second interface 1234 are complementary mating interfaces such that the first protrusions 1230 fit into the second recesses 1238 and the second protrusions 1236 fit into the first recesses 1232. A gap is shown between the adhesion spacer 1208 and the inner adhesion structure 1218 to illustrate the complementary interface of the first interface 1228 and the second interface 1234. The inner adhesion structure 1218 does not impede the connections of the Inner interconnects 1216 with the topside 1214.

The adhesion spacer 1208 forms a predetermined adhesion with the active side 1210 to mitigate or eliminate delamination at this interface. The inner adhesion structure 1218 and the adhesion spacer 1208 also forms a predetermined adhesion with each other that is better than the adhesion formed between the adhesion spacer 1208 and the inner encapsulation 1222. The adhesion between the inner adhesion structure 1218 and the adhesion spacer 1208 mitigates or eliminates delamination at this interface.

The internal interconnects 1212 also connect the terminals 1219 and the package substrate 1204. External interconnects 1220 connect to the package substrate 1204 on a side opposite the integrated circuit die 1202. The External interconnects 1220 connect to the next system level (not shown). A package encapsulation 1224 is over a side of the package substrate 1204 having the integrated circuit die 1202. The package encapsulation 1224 covers the integrated circuit die 1202, the adhesion spacer 1208, the internal interconnects 1212, and a portion of the integrated circuit package system 1211. An opening 1226 in the package encapsulation 1224 exposes portions of the terminals 1219, portions of the inner encapsulation 1222, and the paddle 1217.

Figure 13:
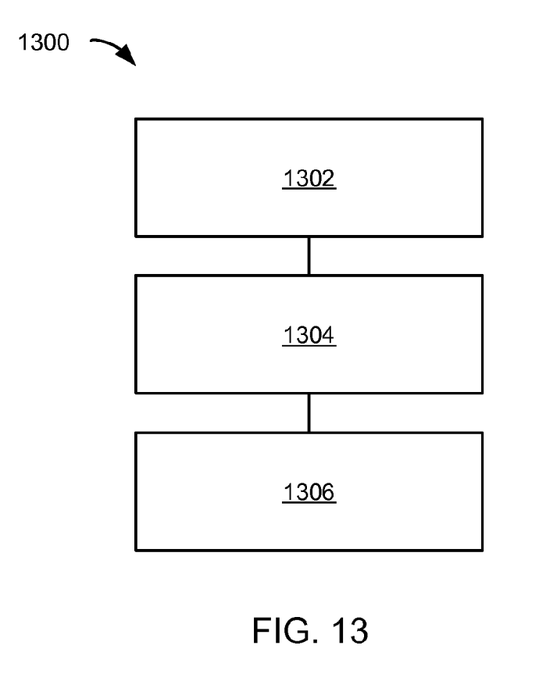
FIG. 13 is a flow chart of a mountable integrated circuit package-in-package system for manufacture of the mountable integrated circuit package-in-package system in an embodiment of the present invention.

Referring now to FIG. 13, therein is shown a flow chart of a mountable integrated circuit package-in-package system 1300 for manufacture of the mountable integrated circuit package-in-package system 100 in an embodiment of the present invention. The system 1300 includes mounting an adhesion spacer over an integrated circuit die and a package substrate in a block 1302; mounting an integrated circuit package system having an inner adhesion structure with the inner adhesion structure on the adhesion spacer in a block 1304; and forming a package encapsulation for covering the integrated circuit package system over the adhesion spacer in a block 1306.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package-in-package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A mountable integrated circuit package-in-package system comprising:
   mounting an adhesion spacer over an integrated circuit die and a package substrate;
   mounting an integrated circuit package system having an inner adhesion structure with the inner adhesion structure on the adhesion spacer; and
   forming a package encapsulation for covering the integrated circuit package system over the adhesion spacer.

2. The system as claimed in claim 1 wherein forming the package encapsulation includes forming the package encapsulation having an opening and the opening exposes a portion of the integrated circuit package system.

3. The system as claimed in claim 1 further comprising mounting a device in an opening of the package encapsulation and over the integrated circuit package system exposed by the opening.

4. The system as claimed in claim 1 further comprising forming the integrated circuit package system having an inner encapsulation and a prepackaged integrated circuit die with the inner encapsulation exposing the prepackaged integrated circuit die.

5. The system as claimed in claim 1 further comprising:
   forming the adhesion spacer having a first protrusion and a first recess; and
   forming the inner adhesion structure having a second protrusion and a second recess that is complementary to the first protrusion and the first recess.

6. A mountable integrated circuit package-in-package system comprising:
   mounting an integrated circuit die over a package substrate;
   mounting an adhesion spacer over the integrated circuit die;
   forming an integrated circuit package system having a prepackaged integrated circuit die, an inner encapsulation, and an inner adhesion structure exposed from the inner encapsulation;
   mounting the integrated circuit package system over the adhesion spacer with the inner adhesion structure on the adhesion spacer; and
   forming a package encapsulation having an opening for covering the adhesion spacer and the integrated circuit die with the opening partially exposing the integrated circuit package system over the package substrate.

7. The system as claimed in claim 6 wherein forming the integrated circuit package system includes mounting the prepackaged integrated circuit die over an interposer of the integrated circuit package system.

8. The system as claimed in claim 6 wherein forming the integrated circuit package system includes mounting the inner adhesion structure on the prepackaged integrated circuit die.

9. The system as claimed in claim 6 wherein forming the integrated circuit package system includes forming the inner encapsulation between the inner adhesion structure and the prepackaged integrated circuit die.

10. The system as claimed in claim 6 further comprising forming the integrated circuit package system having a paddle.

11. A mountable integrated circuit package-in-package system comprising:
    a package substrate;
    an integrated circuit die over the package substrate;
    an adhesion spacer over the integrated circuit die;
    an inner adhesion structure;
    an integrated circuit package system having the inner adhesion structure, the inner adhesion structure on the adhesion spacer; and
    a package encapsulation for covering the integrated circuit package system over the adhesion spacer.

12. The system as claimed in claim 11 wherein the package encapsulation includes an opening that exposes a portion of the integrated circuit package system.

13. The system as claimed in claim 11 further comprising a device in an opening of the package encapsulation and over the integrated circuit package system exposed by the opening.

14. The system as claimed in claim 11 wherein the integrated circuit package system includes an inner encapsulation and a prepackaged integrated circuit die exposed by the inner encapsulation.

15. The system as claimed in claim 11 wherein:
    the adhesion spacer includes a first protrusion and a first recess; and the inner adhesion structure includes a second protrusion and a second recess that is complementary to the first protrusion and the first recess.

16. The system as claimed in claim 11 wherein:

the package substrate is connected to an external interconnect;

the integrated circuit die is connected with the package substrate with an internal interconnect;

the adhesion spacer is on the integrated circuit die;

the inner adhesion structure is on the adhesion spacer;

the integrated circuit package system includes a prepackaged integrated circuit die and the inner adhesion structure; and the package encapsulation having an opening is a cover for the adhesion spacer and the integrated circuit die with the integrated circuit package system exposed by the opening.

17. The system as claimed in claim 16 wherein the integrated circuit package system includes an interposer and the prepackaged integrated circuit die over the interposer.

18. The system as claimed in claim 16 wherein the integrated circuit package system includes the inner adhesion structure on the prepackaged integrated circuit die.

19. The system as claimed in claim 16 wherein the integrated circuit package system includes the inner encapsulation between the inner adhesion structure and the prepackaged integrated circuit die.

20. The system as claimed in claim 16 wherein the integrated circuit package system includes a paddle.

* * * * *